(12) United States Patent
Van Gemert et al.

(10) Patent No.: US 8,217,281 B2
(45) Date of Patent: Jul. 10, 2012

(54) PACKAGE, METHOD OF MANUFACTURING A PACKAGE AND FRAME

(75) Inventors: Leonardus A. E. Van Gemert, Nijmegen (NL); Marcus F. Donker, Wijchen (NL)

(73) Assignee: NXP B.V., Eindhoven (NL)

( * ) Notice: Subject to any disclaimer, the term of this patent is extended or adjusted under 35 U.S.C. 154(b) by 382 days.

(21) Appl. No.: 12/594,596

(22) PCT Filed: Apr. 8, 2008

(86) PCT No.: PCT/IB2008/051333
§ 371 (c)(1),
(2), (4) Date: Oct. 3, 2009

(87) PCT Pub. No.: WO2008/122959
PCT Pub. Date: Oct. 16, 2008

(65) Prior Publication Data
US 2010/0051345 A1 Mar. 4, 2010

(30) Foreign Application Priority Data
Apr. 10, 2007 (EP) .................................... 07105861

(51) Int. Cl.
*H01L 23/48* (2006.01)
(52) U.S. Cl. ........ 174/528; 174/534; 257/676; 257/692; 29/841
(58) Field of Classification Search ................ 174/521, 174/528, 534; 257/676, 690, 692; 29/841
See application file for complete search history.

(56) References Cited

U.S. PATENT DOCUMENTS

| | | | |
|---|---|---|---|
| 6,306,685 B1 | 10/2001 | Liu et al. | |
| 6,348,726 B1 * | 2/2002 | Bayan et al. | 257/666 |
| 6,380,062 B1 | 4/2002 | Liu | |
| 6,429,508 B1 * | 8/2002 | Gang | 257/678 |
| 6,433,277 B1 * | 8/2002 | Glenn | 174/537 |
| 6,683,368 B1 | 1/2004 | Mostafazadeh | |
| 6,740,961 B1 | 5/2004 | Mostafazadeh | |
| 7,064,419 B1 | 6/2006 | Bayan et al. | |
| 7,095,096 B1 | 8/2006 | Mostafazadeh | |
| 2001/0014538 A1 | 8/2001 | Kwan et al. | |
| 2002/0041014 A1 | 4/2002 | Ernst et al. | |
| 2002/0136872 A1 * | 9/2002 | Furuta et al. | 428/200 |
| 2002/0168796 A1 * | 11/2002 | Shimanuki et al. | 438/106 |
| 2003/0075792 A1 | 4/2003 | Ruthland | |

FOREIGN PATENT DOCUMENTS

| | | | |
|---|---|---|---|
| EP | 1160858 A | 12/2001 | |
| WO | 03/085728 A | 10/2003 | |

* cited by examiner

*Primary Examiner* — Hung Ngo

(57) ABSTRACT

The package comprises a chip and a plurality of frame contact pads. The chip is attached to the frame contact pads in a die attach area with a die attach adhesive. The chips is coupled to frame contact pads outside the die attach area with connecting elements. The chip, the connecting elements and the frame contact pads outside the die attach area are anchored in an electrically insulating encapsulation. The frame contact pads each comprise a first patterned layer and a second patterned layer, which second layer has the surface that is exposed outside the encapsulation. At least a portion of the frame contact pads in the die attach area has a first patterned layer with a first pattern that comprises at least one flange/lead that is outside the second patterned layer when seen in perpendicular projection of the first layer on the second layer.

8 Claims, 10 Drawing Sheets

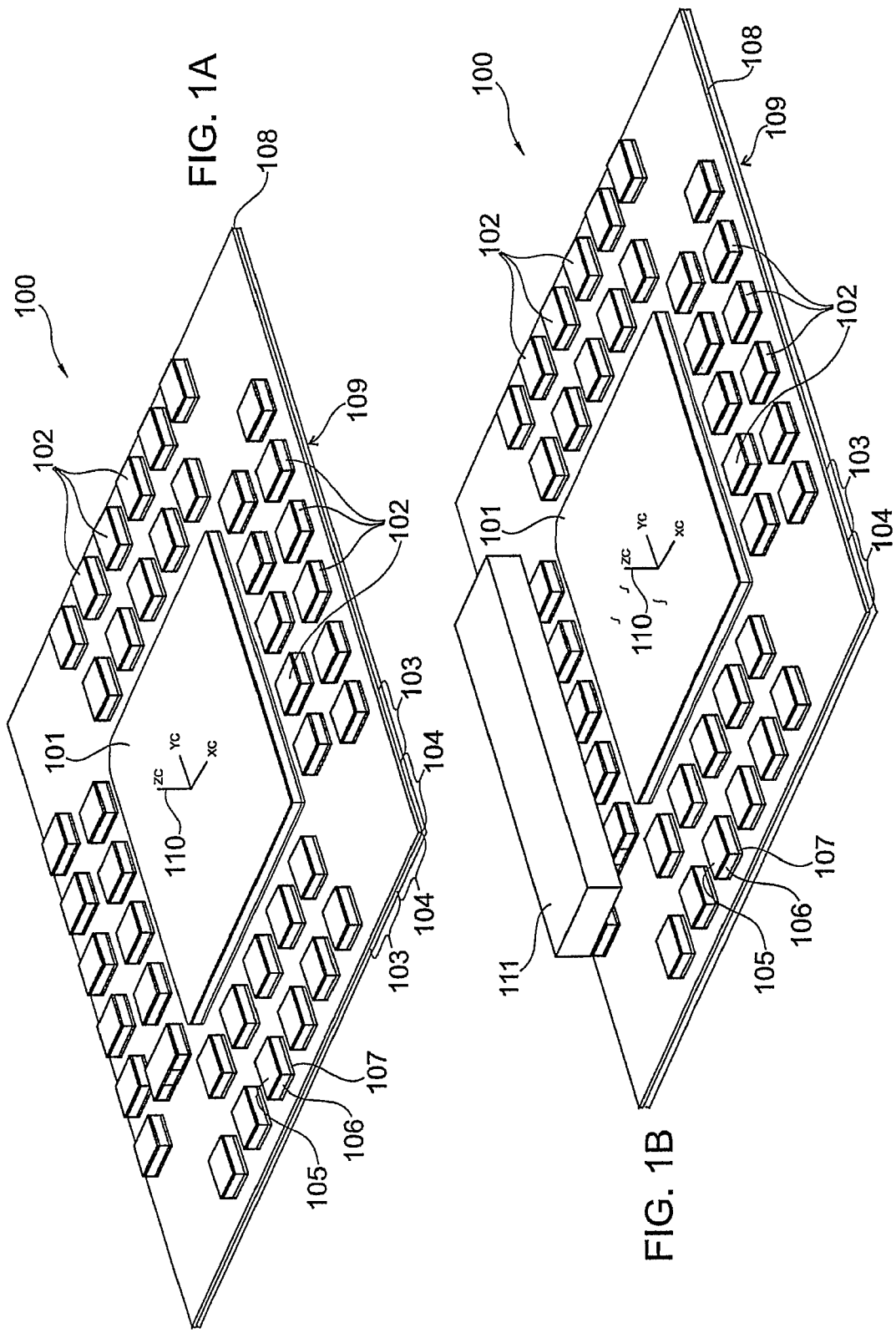

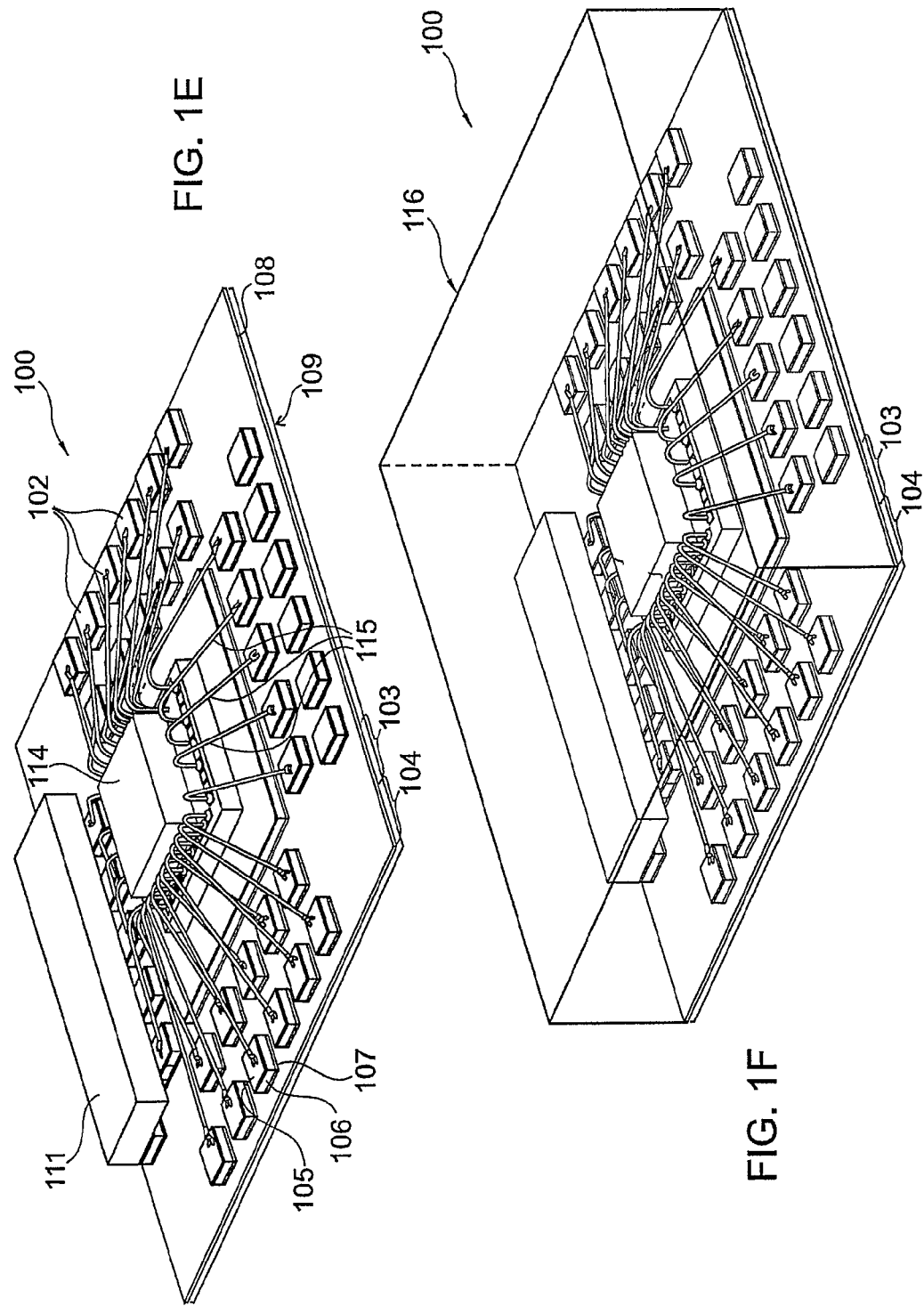

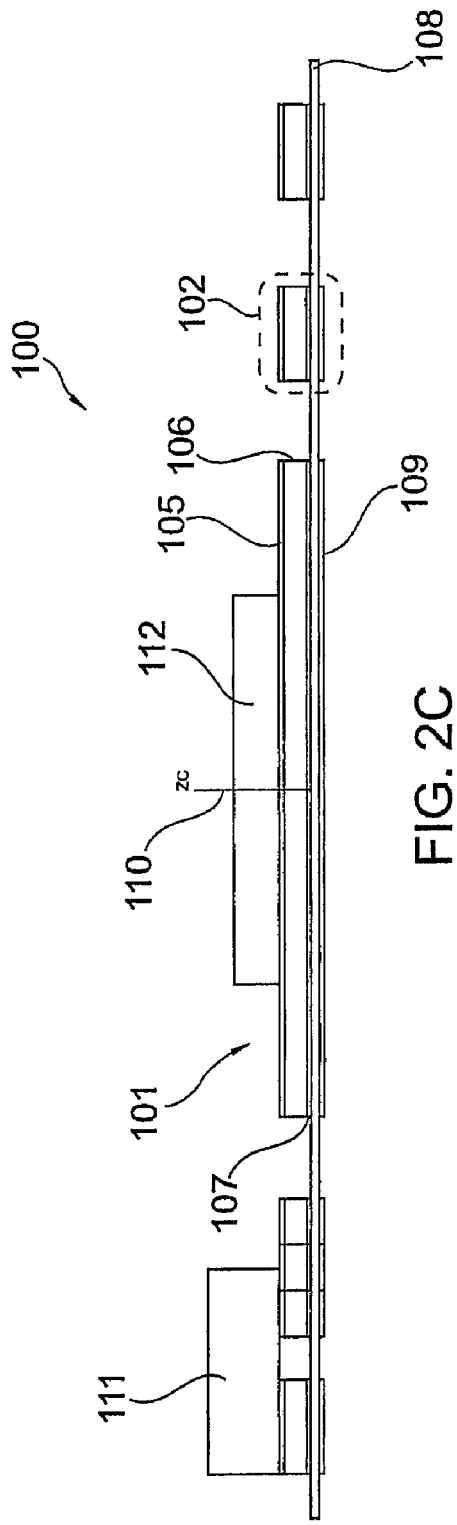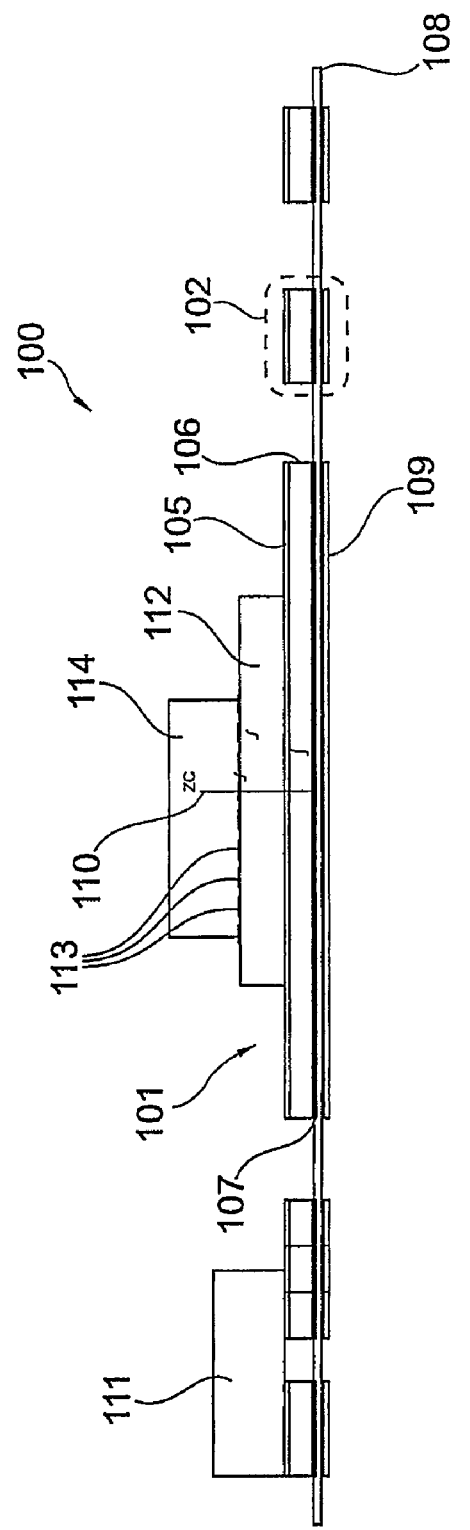

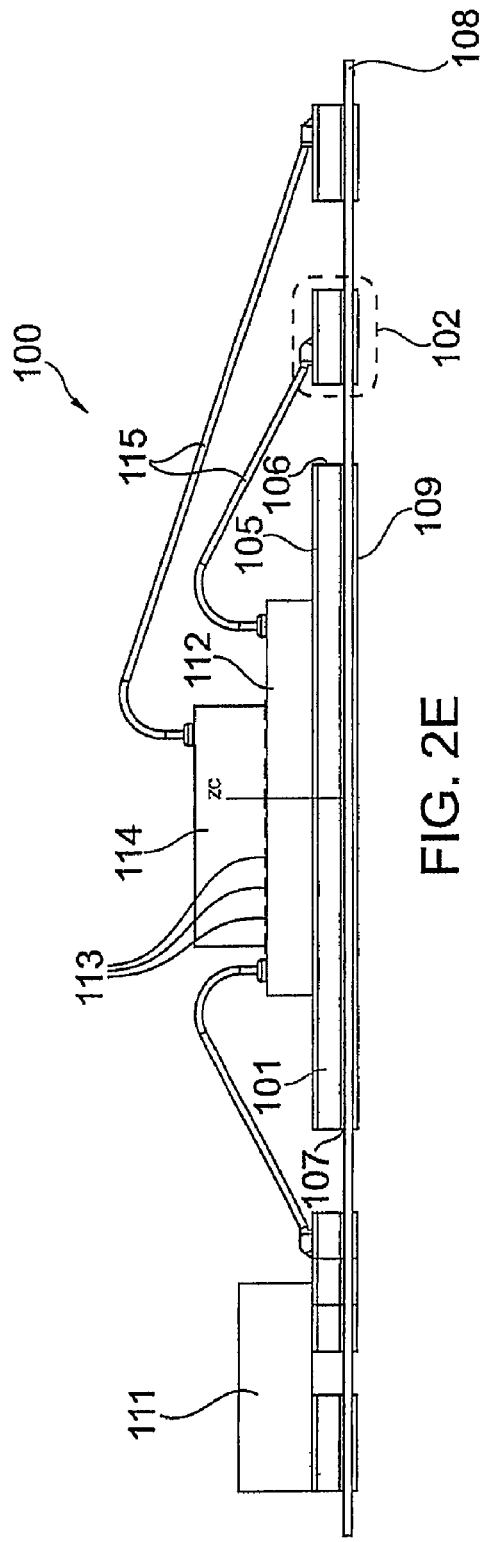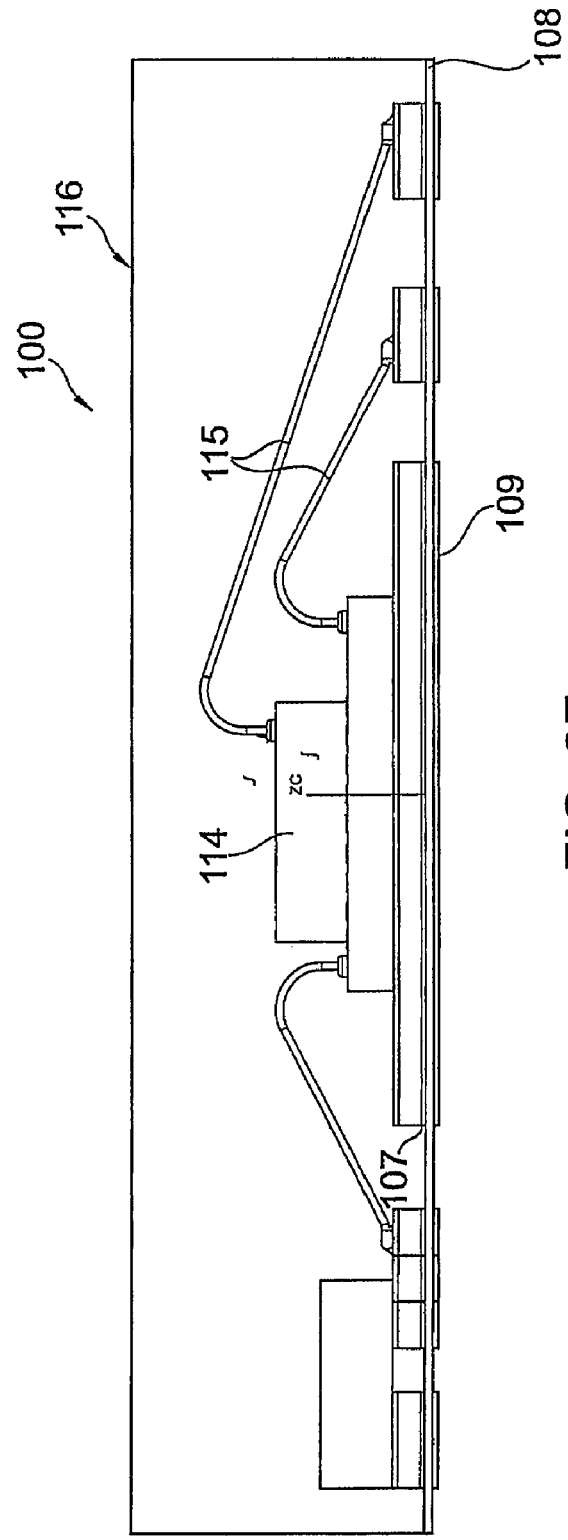

PACKAGE, METHOD OF MANUFACTURING A PACKAGE AND FRAME

FIELD OF THE INVENTION

The invention relates to a package comprising an electronic device with a plurality of device contact pads and further a plurality of electrically conductive frame contact pads, which device is attached to the frame contact pads in a die attach area with a die attach adhesive, which device contact pads are coupled to frame contact pads outside the die attach area with connecting elements, and which device and which connecting elements are encapsulated in an electrically insulating encapsulation, in which encapsulation the frame contact pads outside the die attach area are anchored, and which frame contact pads have a surface that is exposed outside the encapsulation.

The invention further relates to a method of manufacturing such a package, and to a frame comprising the plurality of frame contact pads.

BACKGROUND OF THE INVENTION

Such a package and such a method are known from U.S. Pat. No. 6,683,368. This patent shows a package with identical contact pads inside and outside the die attach area. Therewith, the frame of the individual contact pads is a "universal frame": a single frame is suitable for the packaging of semiconductor devices—hereinafter also referred to as dies—of different sizes without redesign of the frame. In the known method, wirebonding is applied for coupling the device contact pads to the frame contact pads, that are connected with a second, continuous layer. In other words, the connecting elements are wirebonds. An epoxy, tape or the like is used as a die attach adhesive (col. 3, line 52). An encapsulation is applied subsequently by conventional molding (col. 3, lines 63). If a dispensing method is applied [for the molding], a dam may be placed around the leadframe. After application of the mould, the second layer of the frame is removed. It further suggests that the frame contact pads may be rectangular or have some other cross-section instead of having a square cross-section (col. 6, line 18). The number of frame contact pads in the die attach area is at least two, and for a square chip, preferably at least four. A smaller pitch may be used (column 4, line 63-67).

It is a disadvantage of the known package that it tends to be large. If four frame contact pads are present in the die attach area, and the frame is universal, both the length and the width of the package are at least three times as large as that of the chip to accommodate only 60 functional contact pads. This is not acceptable anymore. If more than four frame contact pads are present in the die attach area, the size of the package tends to be less critical, although a doubling of length to accommodate 56 functional pads (with 16 pads in the die attach area) is still not preferred. However, the contact pad size cannot be reduced endlessly, as the surface of the contact pad that is exposed from the package, should meet the requirements for mounting on a printed circuit board. Moreover, one needs a minimum distance for appropriate separation of the encapsulation into individual packages.

BACKGROUND OF THE INVENTION

It is therefore a first object of the invention to provide an improved package, in which there is an adequate filling of the areas between the pads below a chip, particularly in case of a relatively large chip surface and a relatively thin top layer of the frame.

It is a second object of the invention to provide a method of manufacturing the package.

The first object is achieved in that:
the frame contact pads each comprise a first patterned layer and a second patterned layer, which second layer has the surface that is exposed outside the encapsulation,
at least a portion of the frame contact pads in the die attach area has a first patterned layer with a first pattern that comprises at least one flange/lead that is outside the second patterned layer when seen in perpendicular projection of the first layer on the second layer.

The second object is achieved as claimed in the independent method claim.

In the package of the invention, the frame has a first patterned layer and a second patterned layer. The first patterned layer comprises a flange. When placing a die on the frame with regular patterns, there is most probably a frame contact pad with a flange that is only partially covered by the die. This flange can be used for the provision of a wirebond to said frame contact pad. The second patterned layer, of which a surface constitutes a terminal of the package, is however located inside the die attach area. In other words, the density of terminals is optimized, while the functionality of a regular pattern is maintained.

It is believed suitable that the frame has a uniform design, in which any pads in the die attach area have the same size and shape as outside the die attach area. This would substantially reduce the costs of the frame, since one frame design can be used for several applications. Additionally, the subdivision of the die pad in such plurality of pads of uniform size most efficiently solves any problems with the removal of moisture from the die attach adhesive. Such solutions contribute to meeting the MSL-tests in the qualification of products.

It is observed that it is not technically necessary to have a regular pattern throughout the frame. In other words, the frame contact pads with the flange may be present in a limited area of the frame only, and the regularity of patterns is interrupted. Nevertheless the extension of the regular pattern throughout the frame is believed to be most beneficial.

It is further observed for clarity that the term 'frame' refers here to a carrier with the first and second patterned layers. In a most suitable embodiment, the frame is of the kind disclosed in WO-A 2003/85728; in this embodiment, the second patterned layer is only patterned after the provision of the encapsulation. Thereafter, the frame is in fact subdivided into a plurality of individual frame contact pads. The mechanical integrity is then maintained in that the frame contact pads are anchored or embedded within the encapsulation and/or another filling layer. This frame of WO2003/85728 is suitably used with a very thin intermediate layer. It has the advantage of inherent solder adhesive layers, which are also used as etch masks. The manufacture by means of etching results in an anchoring of the pads into the compound and die attach adhesive through the non-planarity/flatness of the side faces of the die pads.

It will be understood that it is not necessary that all frame contact pads have the same shape, in order to arrive at a regular pattern. In fact, there may be a unit that is regularly repeated, which unit may comprise several different patterns. Alternatively and/or additionally, there may be a first and a second area comprising different frame contact pads with different patterns, which first and second area are laterally spaced apart.

The flange is in the context of the present application a conductor with a lateral extension resulting in a non-square shape. The shape in top view may be rectangular or otherwise. Good results are expected from a tripod or Y-shape, which allows a very regular division—uniform density—of the pads in the frame. It further can be etched adequately. Other shapes include T-shapes, L-shapes and X-shapes. S-, 2- and Z-shapes and derivatives thereof with other internal angles between the legs of the basic shape are also interesting options.

The advantage of such lateral extension is at least two-fold: first, it can be used as an interconnect track with low resistance. Such a interconnect track is particularly useful in case of a multichip package. The low ohmic connection may then be made with a plurality of tracks which are mutually connected, for instance with wirebonds. Another useful feature of the interconnect track is that its lateral extension allows the provision of more wirebonds to a single pad. Secondly, it may be used for rerouting, particularly for rerouting to a position within the die attach area. The latter function may reduce the overall package size.

A most advantageous modification hereof is that the lateral extension is present in the upper layer, while in a corresponding portion of the lower layer a pad with a standard shape is defined. Then, the resulting packages may have a standard and accepted footprint. A standard shape is herein for instance a square, a round or a somewhat rectangular shape, with a pitch of for instance 0.4, 0.5, or 0.8 mm.

Suitably, in combination herewith, the upper layer of the frame has a small thickness, for instance in the order of 10 to 100 microns, more suitably in the order of 20 to 60 microns. Then the lateral extensions will not reduce an average distance between neighboring pads in the frame (also known as pitch).

Particularly with the embodiment of a regular Y-, T-, I- or L-shaped patterns, spaces between these patterns tend to get the form of channels. It is therefore understood to be advantageous to fill the channels, and particularly those in the die attach area with an adhesive, instead of with molding compound.

One suitable embodiment of an adhesive is an adhesive applied at the back side of the die. Such adhesive is known in the art as a Wafer Back Coating, or a Wafer Back Laminate, as commercially available from chemical suppliers such as Henkel. The Wafer Back Laminate as currently available allow filling of the channels, if the thickness of the first patterned layer is less than 40 microns, more suitably less than 30 microns. Evidently, this depends to a certain extent on several factors such as:
 the number of channels (and particularly the area filled relative to the total die attach area,
 the width of the channel (which could make the adhesive flow outside the die attach area)
 the further development of Wafer Back Laminate Another suitable alternative to provide the adhesive is the use of a paste to the frame. Such a paste can be provided with screenprinting or a similar technique. The paste appears less suitable in case the channel width is reduced to less than 5 or 10 microns.

A most suitable alternative to provide the adhesive is the use of a two-layered type adhesive, that is available for die to die bonding with wires that need protection. On application, the first layer (adjacent to the die) is harder than the second layer (exposed). A gentle heating step allows filling of the spaces. A further curing step (possibly simultaneous with the overmoulding) would make this very hard.

In an even further embodiment, the chip is assembled to the frame in a die attach area, which die attach area has an inner area and a further area. The die attach adhesive is applied in the inner area, while leaving the further area free; and the encapsulation is applied so as to fill the further area, therewith mechanically anchoring the chip. In this embodiment, the area in which the die attach adhesive is applied is reduced, in comparison to packages with a conventional die attach pad extending in the complete die attach area. The further area, particularly an area near to the edge of the chip, is then filled during the provision of the encapsulation. The further area that is filled with molding compound may be ring-shaped. Alternatively, it may comprise a plurality of areas within the die attach area, each of those extending to an edge of the die attach area. The number of areas could be two or more, for instance four.

BRIEF DESCRIPTION OF THE DRAWINGS

The invention will be described in more detail hereinafter with reference to examples of embodiment but to which the invention is not limited:
FIGS. 1A to G schematically show perspective views of a packaging process wherein the invention may be implemented
 FIGS. 2A to G schematically show cross-sectional views of the packaging process depicted in FIGS. 1A to 1G.

DESCRIPTION OF EMBODIMENTS

Figure 1C:
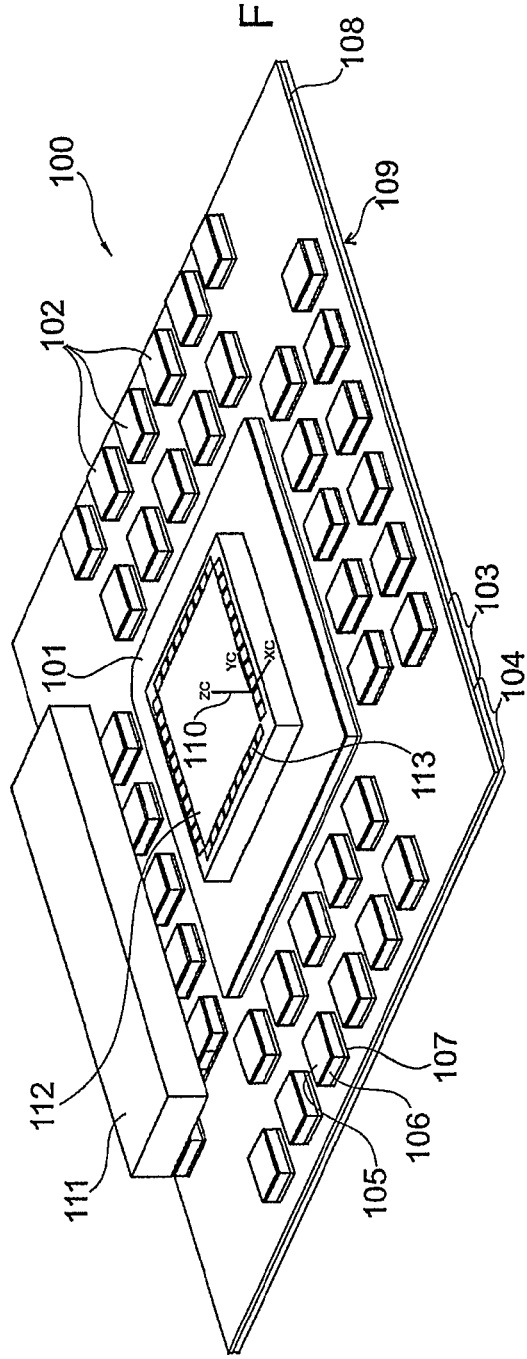

The illustration in the drawing is schematically. In different drawings, similar or identical elements are provided with the same reference signs. The invention will be illustrated with reference to FIGS. 3 to 5. In order to improve the understanding, FIGS. 1A-G and 2A-G disclose a process for manufacturing a semiconductor chip package, in which the invention may be implemented.

FIG. 1A shows a perspective view of a carrier 100 comprising a die pad 101 which is arranged in the center of the carrier 100. Furthermore, the carrier comprises a plurality of frame contact pads 102 arranged in two rings around the die pad 101. The two rings are substantially rectangular, wherein a first ring 103 is closer to the die pad and may be called an inner ring, while a second ring 104 is arranged farther away from the die pad than the first ring and thus may be called an outer ring. The die pad 101 and the frame contact pads 102 are all made of a multilayered structure, which multilayered structure is indicated in the Figures by the different layers. In particular, the whole multilayered structure is electrically conductive, e.g. all layers are formed by metal layers. Preferably, the multilayered structure comprises at least a surface layer 109, a second conductive layer 108 and a barrier layer disposed in between. In particular, the barrier layer is a thin palladium layer, e.g. about 0.1 .mu.m, that is a sublayer of the surface layer 109, i.e. the surface layer 109 itself is a multilayered structure comprising layers of gold, palladium and nickel, wherein the gold layer is the outermost layer. Possible materials for the multilayer stack may be for the conductive layers copper, silver or alloys thereof and for the buffer layer aluminum, FeNi, FeCrNi, stainless steel, or alloys thereof. The barrier layers may also be called buffer layers. Furthermore, the multilayer structure comprises a buffer layer 107, a first conductive layer 106 and an adhesive layer 105, wherein the adhesive layer 105 may have the same composition, i.e. substructure, as the surface layer 109. In addition, a coordinate system 110 is shown in FIG. 1A indicating an x-direction XC, a y-direction YC and a z-direction ZC. In FIG. 1A it is also shown that the frame contact pads 102 of the first ring 103 are staggered with respect to the frame contact pads 102 of the second ring 104, i.e. the frame contact pads 102 of the inner ring 103 are arranged parallel to the spacing between the frame contact pads 102 of the outer ring 104.

FIG. 1B shows a perspective view of the carrier 100 of FIG. 1A after a first processing step. In particular, a conductor 111, passive element or another electronic component is attached to one row of the inner ring 103 and the outer ring 104. The conductor 111 may be conventionally bonded to the frame contact pads, e.g. by soldering.

FIG. 1C shows a perspective view of the carrier 100 of FIG. 1B after a next processing step. In particular, an intermediate pad 112 is bonded to the surface layer of the die pad 101. The intermediate pad 112 comprises contact elements 113.

Figure 1D:
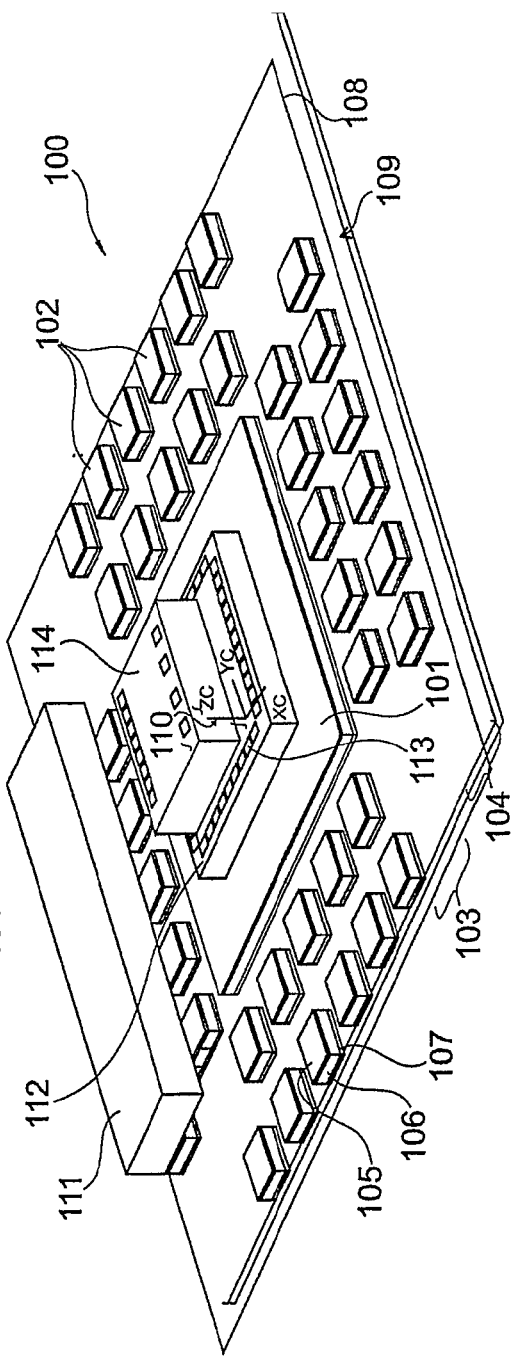

FIG. 1D shows a perspective view of the carrier 100 of FIG. 1C after a next processing step. In particular, a semiconductor chip 114 is bonded to the intermediate pad 112. The bonding is conventionally achieved with a die attach adhesive. One advantageous manner hereof is the provision of the die attach on the backside of the semiconductor chip, in the form of either a coating or a laminate.

FIG. 1E shows a perspective view of the carrier 100 of FIG. 1D after a next processing step. In particular, a plurality of bonding wires 115 are attached to electrically connect some of the contacts elements 113 and some of the frame contacts pads 102 of the carrier. In this example, but that is not essential, the semiconductor chip 114 is bonded to the intermediate pad 112, and through the contact elements 113 electrically coupled to the frame contact pads 102. It will be understood, though, that the chip 114 may alternatively be attached directly to the die pad.

FIG. 1F shows a perspective view of the carrier 100 of FIG. 1E after a next processing step. In particular, an encapsulation 116 is applied to the carrier 100 which encapsulation 116 encloses the upper part of the carrier 100, i.e. the frame contact pads 102, the intermediate pad 112, the semiconductor chip 114 and the bonding wires 115. However, the encapsulation 116 does not enclose the second conductive layer 108 and the surface layer 109 which are arranged on the underside of the carrier 100.

Figure 1G:
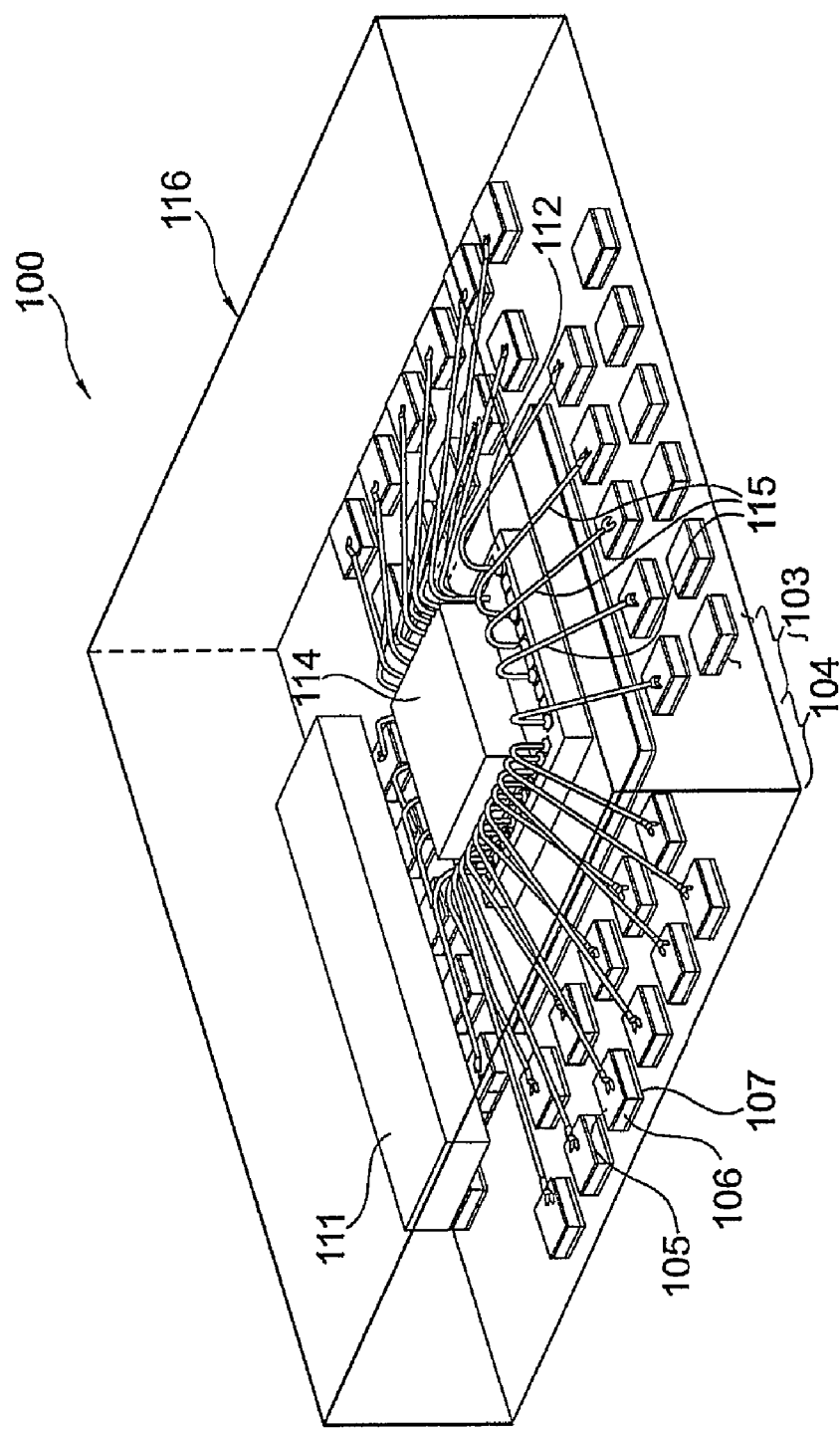

FIG. 1G shows a perspective view of the carrier 100 of FIG. 1F after a next processing step. In particular, the underside of the carrier 100 is structured; in particular the surface layer 109, the second conductive layer 108 and/or the buffer layer 107 may be structured in order to provide terminals that may be used to contact the encapsulated semiconductor chip 114. The buffer layer 107 is preferably structured in order to electrically insulate the individual contact pads from each other.

Figure 2A:
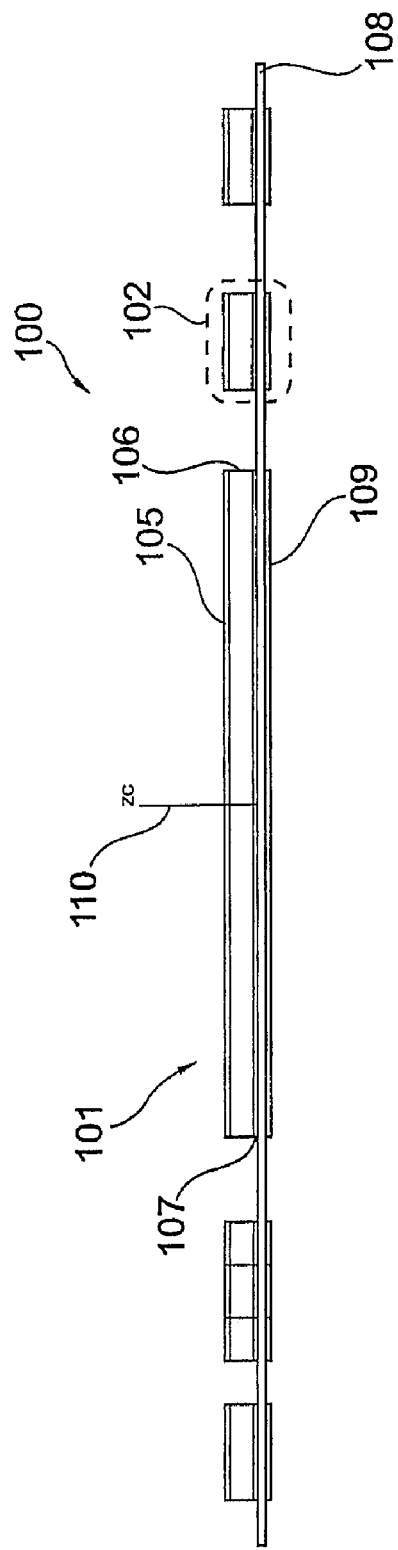

In the following, referring to FIGS. 2A to G, the process for manufacturing a semiconductor chip package of FIGS. 1A to G is further described. In particular, the FIG. 2A to G showing cross-sectional views of the perspective views of FIG. 1A to 1G FIG. 2A shows a cross-sectional view of the carrier 100 of FIG. 1A with the die pad 101, the plurality of frame contact pads 102. Furthermore, the multilayered structure can be more clearly seen in FIG. 2A than in FIG. 1A. In particular, the surface layer 109, the second conductive layer 108, the buffer layer 107, the first conductive layer 106 and the adhesive layer 105 are shown in FIG. 2A. In addition, the z-direction ZC is indicated in FIG. 2A.

Figure 2B:
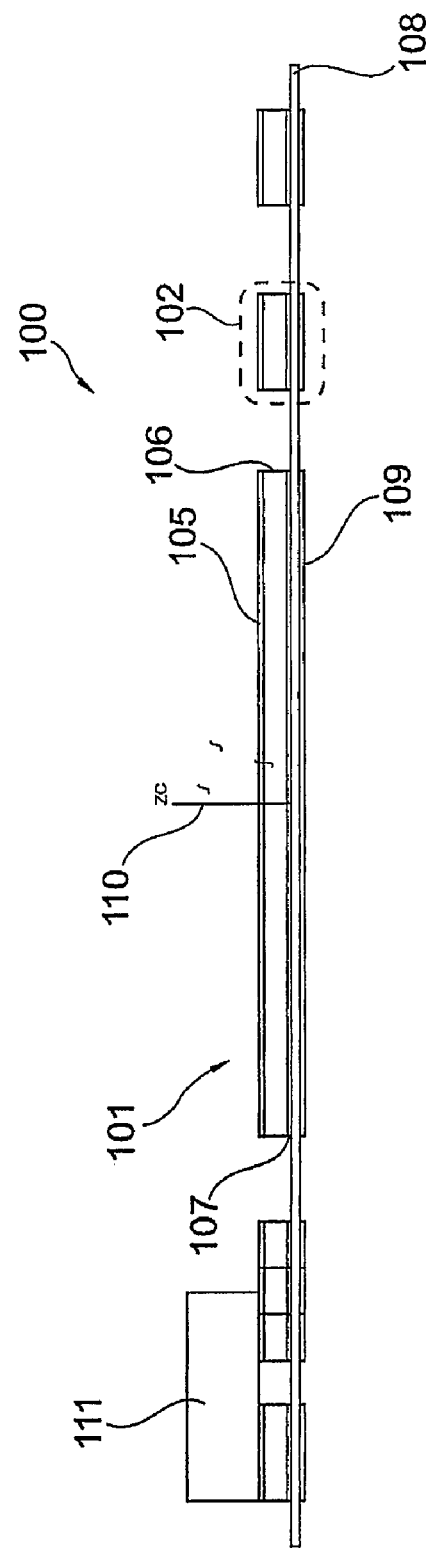

FIG. 2B shows a cross-sectional view of the carrier 100 of FIG. 1B. In particular, the conductor 111 is attached to one row of the inner ring 103.

FIG. 2C shows a cross-sectional view of the carrier 100 of FIG. 1C. In particular, the intermediate pad 112 is bonded to the surface layer of the die pad 101.

FIG. 2D shows a cross-sectional view of the carrier 100 of FIG. 1D. In particular, the semiconductor chip 114 is bonded to the intermediate pad 112.

FIG. 2E shows a cross-sectional view of the carrier 100 of FIG. 1E. In particular, the plurality of bonding wires 115 are attached to electrically connect some of the contact elements 113 and some of the frame contact pads 102 of the carrier.

FIG. 2F shows a perspective view of the carrier 100 of FIG. 1F. In particular, the encapsulation 116 is applied to the carrier 100 which encapsulation encloses the upper part of the carrier 100, i.e. the frame contact pads 102, the intermediate pad 112, the semiconductor chip 114 and the bonding wires 115. However, FIG. 2F clearly shows that the encapsulation 116 does not enclose the second conductive layer 108 and the surface layer 109 which are arranged on the underside of the carrier 100.

Figure 2G:
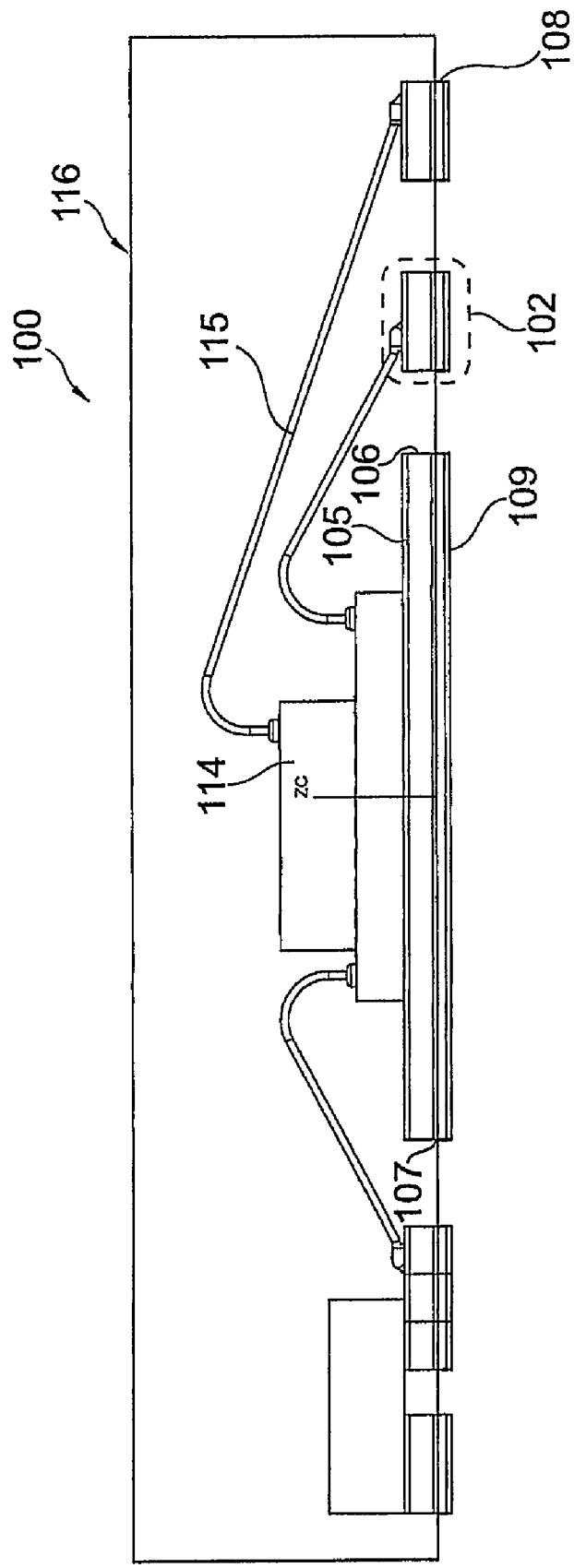

FIG. 2G shows a cross-sectional view of the carrier 100 of FIG. 1G. In particular, the underside of the carrier 100 is structured, i.e. more specific, the second conductive layer 108 and the buffer layer 107 are structured in order to provide terminals that may be used to contact the encapsulated semiconductor chip 114.

Figure 3:
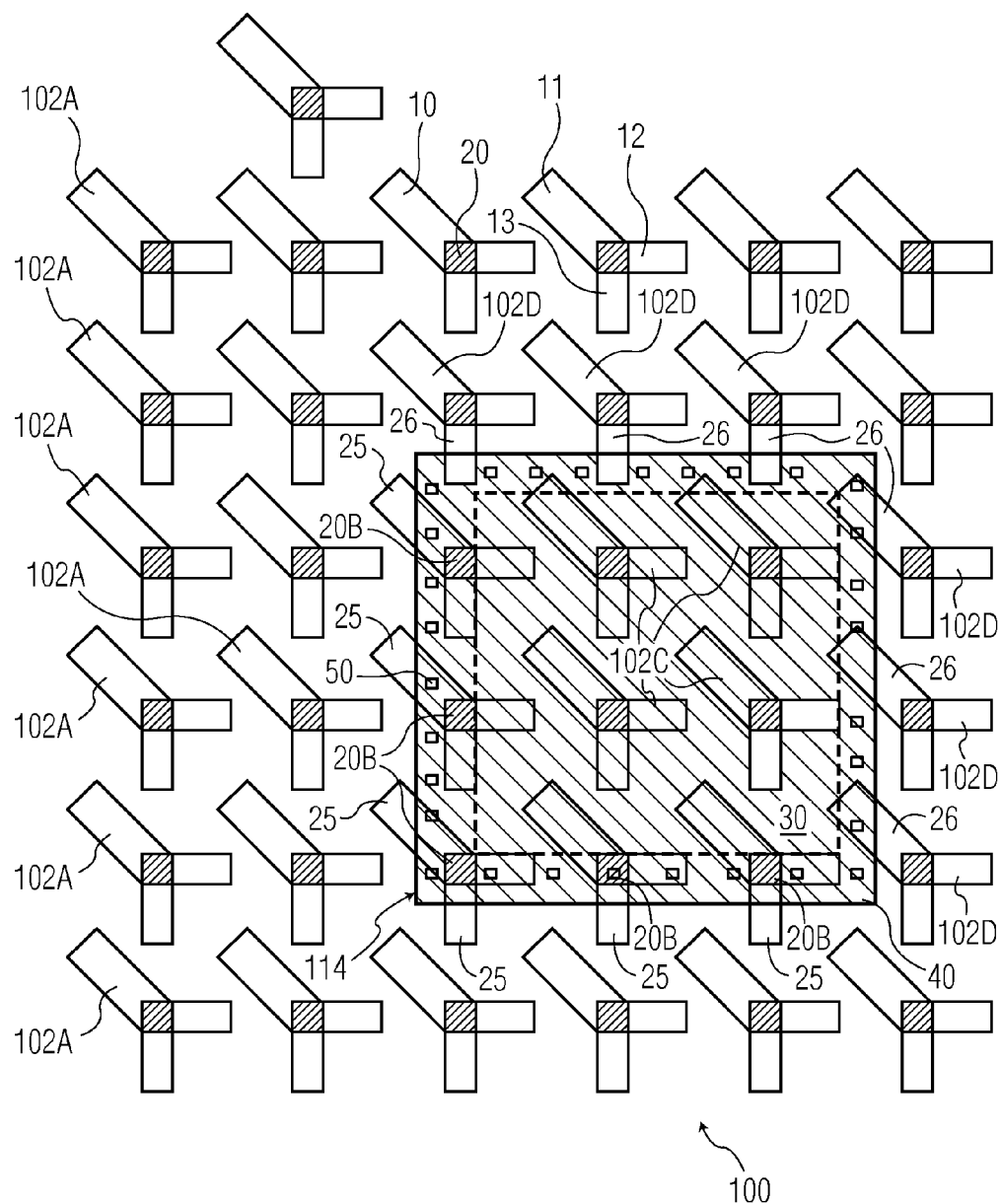
FIG. 3 shows a first embodiment of the invention in a top view.

FIG. 3 shows diagramatically a first embodiment of the invention in a top view. Several features are left out in FIG. 3 to improve the understanding, such as bonding wires and encapsulation. The Figure particularly shows the carrier 100 with frame contact pads 102 and the chip 114. The carrier is divided into a die attach area and an area outside the die attach area. As will be clear from the FIG. 3, it is one of the advantages of the present invention that the die attach area need not to be defined specifically. In fact, the die attach area is herein nothing else than the area of the carrier covered by the chip. In case the chip 114 is replaced by a chip of another size, the die attach area will change accordingly.

The frame contact pads 102 have a repetitive pattern 10 defined in the first conductive layer 106 of the carrier 100. The shaded part 20 therein refers to the terminal, that is exposed from the encapsulation. As indicated with reference to FIGS. 2A-G, the terminals are defined in the second conductive layer 108 and the surface layer 109. Suitably, these terminals are defined by etching through the surface layer 109 after the provision of the encapsulation. The terminals are part of frame contact pads 102. At least some of the frame contact pads 102 are electrically coupled to device contact pads 50 of the chip 114 with connecting elements—not shown. One example of such connecting element is a bondwire. As will be clear from the drawing, the chip 114 rests on a plurality of repetitive features 10. It is therefore preferable, that the die attach adhesive is provided on the backside of the chip 114 in the form of a wafer back coating or laminate. A very suitable embodiment makes use of an adhesive system of at least two layers. The lower of both adhesive layer is able to flow at moderate temperatures, so as to fill any spaces between the features 10. It is however believed that a molding compound is able to flow below the chip through the channel-like spaces between the repetitive features, and that thus a rather simple die attach adhesive already works appropriately. Most suitably appears a combination of both, wherein the die attach adhesive covers an inner area 30 within the dashed line in FIG. 3. The molding compound however covers the further area 40 outside the dashed line in FIG. 3. Therewith, the molding compound extends below the chip 114. This is believed to contribute to the anchoring of the chip in the encapsulation.

The embodiment in FIG. 3 shows a single repetitive feature 10 with a Y-shape and a first, second and third flange 11, 12, 13. The second and third flange 12, 13 mutually enclose an angle of 90 degrees, while the angles with the first flange 11 are 135 degrees. It will be clear that these angles are merely diagrammatical and may vary in practice. As can be understood from FIG. 3, the flanges 11, 12, 13 are on perpendicular projection on the second conductive layer 108 outside this layer 108. In the shown example, all frame contact pads 102 have the same shape, and hence all contact pads below the chip 114 have such flanges 11, 12, 13. It will be understood however, that this is not necessary. The frame contact pads 102C defined in the inner area 30 could be defined without flanges. This would have the advantage that the number of frame contact pads 102C may be increased. It would further have the consequence that the die attach area is again predefined. However, the flexibility of defining the die attach area only during the assembly process itself is not always needed. Moreover, when only the contact pads 102C within the inner area 30 are defined without flanges, the same carrier is nevertheless applicable for chips of different sizes within a certain range. The same applies to the frame contact pads 102A in an outer ring, with reference to the present chip 114. Here again, removal of the flanges leads allows a larger number of contact pads 102A per unit area, but reduces the flexibility to use a single carrier for the manufacture of packages with differently sized chips and differently sized packages.

Additionally, in line with a preferred embodiment of the invention, the FIG. 3 shows that the the frame contact pads 102 are defined such that at least some of the flanges have edges 25 outside the die attach area, i.e. outside the area covered by the chip 114. These edges 25 can be connected to the device bond pads 50. In this manner, the corresponding terminals 20B may be used effectively. One suitable application is for grounding, but use for the provision of power or signals is not excluded. As a result, the package size can be small.

FIG. 3 further shows that there is a number of further frame contact pads 102D with a flange 26 within the die attach area, i.e. below the chip 114. This effect is at least beneficial for a robust and appropriate placement of the chip 114 on the carrier 100. Evidently, in order to make use of these contact pads 102D, any die attach should not be electrically conductive, so as to maintain the isolation of them.

Figure 4:
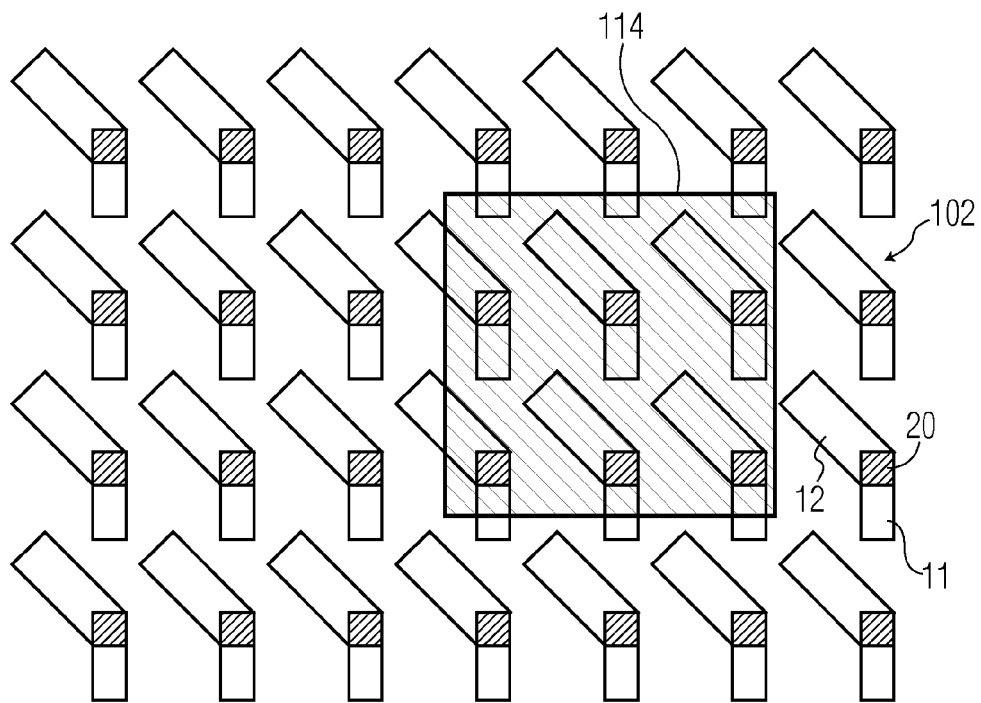
FIG. 4 shows a second embodiment of the invention in a top view.

FIG. 4 diagrammatically shows a second embodiment of the universal leadframe according to the invention. The FIG. 4 is schematical in the same manner as FIG. 3, i.e. it does not show encapsulation or bond wires. The frame contact pads 102 of the embodiment of FIG. 4 have all an identical, repetitive shape, with a first and a second flange. As a result hereof, the density of terminals may be increased in comparison to the first embodiment of FIG. 3. The two flanges enclose an angle of 135 degrees. Other shapes, such as a Z- or S-like shape are possible as well. In this embodiment, as in the first embodiment, the pattern of the terminals 20 constitutes a regular array. Also, all the flanges 11, 12 have a minimum distance between each other, as follows from design rules. The first flange 11 is relatively long in comparison to the second flange 12. This asymmetry is useful in order to use the flange 11 as part of an interconnect.

Figure 5:
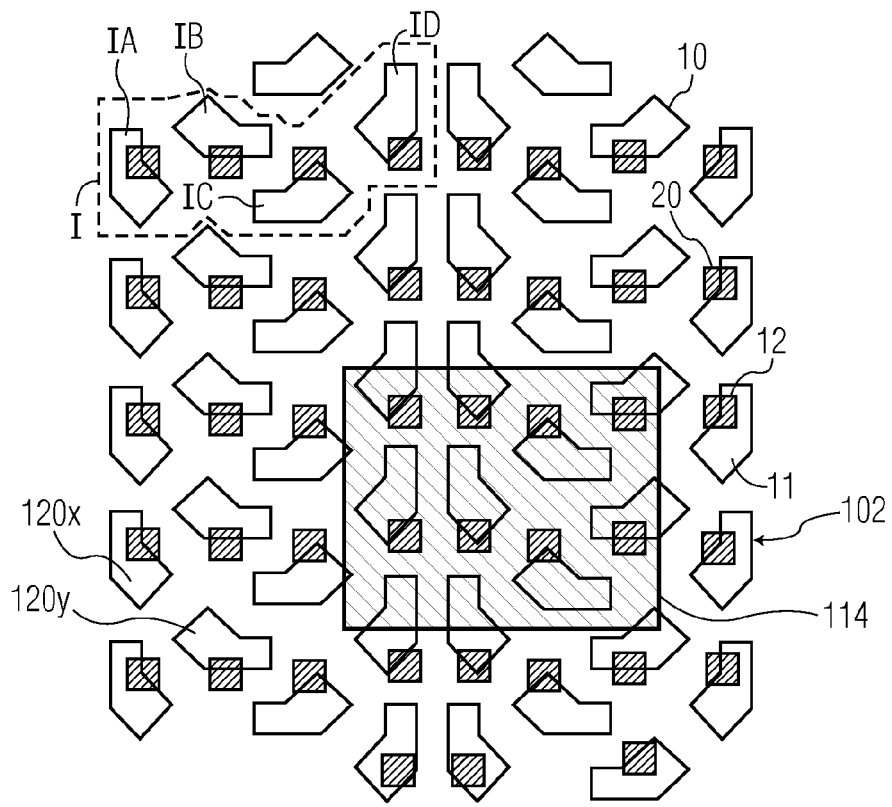
FIG. 5 shows a third embodiment of the invention in a top view.

FIG. 5 diagrammatically shows a third embodiment of the universal leadframe according to the invention. The FIG. 5 is schematical in the same manner as FIG. 3, i.e. it does not show the encapsulation or bond wires. This embodiment differs from the embodiments of FIGS. 3 and 4, in that not all the frame contact pads 102 have the same orientation. Each of the contact pads 102 has a first and a second flange 11, 12 that mutually enclose an angle of approximately 135 degrees. In this example, the first flange has a larger width than the second flange. An additional bulge is possible so as to provide sufficient overlap between the feature 10 in the first layer 106 and the terminal 20 defined in the second layer 108. A first and a second contact pad 120X, 120Y are mutually positioned such that their first flanges 11 face each other. This is deemed beneficial for the provision of interconnects between the two pads with bondwires, and also for the provision of discrete components such as diodes, capacitors, resistors. Effectively, the carrier is divided in blocks I of four contact pads IA, IB, IC, ID, such that within a block I each contact pad has another orientation. Nevertheless, the terminals 20 are defined in a regular array, such that the package can be assembled to a printed circuit board in a conventional manner.

The present embodiment has the advantage, as compared to the embodiments of FIGS. 3 and 4, that the density of terminals is increased. This is particularly due thereto, that the terminals 20 are connected to the rest of the contact pad at mutually different positions, e.g. not always in the center, but also at an edge of a flange. Moreover, the shape of the contact pads 102 is overall less long, i.e. the flanges 11, 12 have in this embodiment a length that is of the same order as the width. Particularly, the length is not more than 1.5 times the width, preferably not more than 1.2 times the width. Herein the length is measured starting along a side of a flange and starting from the center of the contact pad 102. The width is defined in a direction perpendicular to the length as the distance between two side faces. Another advantage of the presence of several orientations is that many contact pads 102 appear well accessible for bond wires. Particularly, the contact pads 102 tend to have a kind of staggered layout.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A package comprising an electronic device with a plurality of device contact pads and further a plurality of electrically conductive frame contact pads, which device is attached to the frame contact pads in a die attach area with a die attach adhesive, which device contact pads are coupled to frame contact pads outside the die attach area with connecting elements, and which device and which connecting elements are encapsulated in an electrically insulating encapsulation, in which encapsulation the frame contact pads outside the die attach area are anchored, and which frame contact pads have a surface that is exposed outside the encapsulation, wherein the frame contact pads each comprise a first patterned layer and a second patterned layer, which second layer has the surface that is exposed outside the encapsulation, at least some of the frame contact pads have their surface exposed outside the encapsulation below and within the die attach area and have a first patterned layer with a first pattern that comprises at least one flange that extends to a position outside the die attach area, such that the flange is partially covered by the die attach area, and wherein the contacting elements connect to the flange outside the die attach area, wherein the first pattern is the same inside the die attach area as outside the die attach area.

2. A package as claimed in claim 1, wherein the first pattern comprises at least three flanges.

3. A package as claimed in claim 2, wherein an angle between individual flanges is in the range of about 60 to 120 degrees.

4. A package as claimed in claim 1, wherein a second portion of the frame contact pads in the die attach area has a first patterned layer with a second pattern.

5. A package as claimed in claim 1, wherein electrical connections between individual contact pads are provided with wirebonds.

6. A package as claimed in claim 1, wherein the die attach adhesive comprises a first and a second layer.

7. A package as claimed in claim 1, wherein the die attach area is divided into a inner area and a perimeter area, and wherein the die attach adhesive is present in the inner area, while the encapsulation extends into the perimeter area of the die attach area, therewith mechanically anchoring the electronic device into the encapsulation.

8. A method of manufacturing a package comprising an electronic device with a plurality of device contact pads and further a plurality of electrically conductive frame contact pads, comprising:

providing a electrically conductive frame having a first layer and a second layer, which first layer is patterned with a first pattern to define a plurality of frame contact pads and which second layer is continuous;

attaching the device to the frame contact pads in a die attach area with a die attach adhesive, electrically coupling the device contact pads to frame contact pads outside the die attach area with connecting elements encapsulating the device and the connecting elements in an electrically insulating encapsulation, which encapsulation extends to encapsulate exposed portions of the first patterned layer of the frame;

patterning the continuous second layer of the frame into the frame with a second pattern to define portions of the frame contact pads with a surface that is exposed outside the encapsulation, wherein the first pattern defines frame contact pads with at least one flange, wherein at least some of the frame contact pads (102) have their surface exposed outside the encapsulation below and within the die attach area, and have at least one flange that extends to a position outside the die attach area, such that the flange is partially covered by the die attach area, wherein the first pattern is the same inside the die attach area as outside the die attach area.

* * * * *